(12) United States Patent
Im et al.

(10) Patent No.: US 11,521,921 B2
(45) Date of Patent: Dec. 6, 2022

(54) SEMICONDUCTOR DEVICE PACKAGE ASSEMBLIES AND METHODS OF MANUFACTURE

(71) Applicant: SEMICONDUCTOR COMPONENTS INDUSTRIES, LLC, Phoenix, AZ (US)

(72) Inventors: Seungwon Im, Seoul (KR); Jeungdae Kim, Gimpo (KR); Oseob Jeon, Seoul (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 201 days.

(21) Appl. No.: 16/668,401

(22) Filed: Oct. 30, 2019

(65) Prior Publication Data

US 2021/0066174 A1    Mar. 4, 2021

Related U.S. Application Data

(60) Provisional application No. 62/895,877, filed on Sep. 4, 2019.

(51) Int. Cl.
| | |
|---|---|
| *H01L 23/498* | (2006.01) |
| *H01L 23/00* | (2006.01) |
| *H01L 23/31* | (2006.01) |
| *H01L 23/495* | (2006.01) |

(52) U.S. Cl.
CPC .... *H01L 23/49811* (2013.01); *H01L 23/3114* (2013.01); *H01L 23/49506* (2013.01); *H01L 23/49568* (2013.01); *H01L 23/49861* (2013.01); *H01L 24/48* (2013.01); *H01L 2224/80895* (2013.01)

(58) Field of Classification Search
None
See application file for complete search history.

(56) References Cited

U.S. PATENT DOCUMENTS

| | | | | |
|---|---|---|---|---|
| 6,329,706 B1* | 12/2001 | Nam | ................. | H01L 23/49503 257/676 |
| 6,404,065 B1* | 6/2002 | Choi | ...................... | H01L 24/06 257/782 |
| 2009/0140369 A1* | 6/2009 | Lee | ......................... | H01L 24/83 257/467 |

(Continued)

*Primary Examiner* — Michelle Mandala
*Assistant Examiner* — Jordan M Klein
(74) *Attorney, Agent, or Firm* — Brake Hughes Bellermann LLP

(57) ABSTRACT

In one general aspect, a semiconductor device package can include a die attach paddle having a first surface and a second surface that is opposite the first surface. The package can also include a semiconductor die coupled with the first surface of the die attach paddle. The package can further include a direct-bonded-metal (DBM) substrate. The DBM substrate can include a ceramic layer having a first surface and a second surface that is opposite the first surface; a first metal layer disposed on the first surface of the ceramic layer and coupled with the second surface of the die attach paddle; and a second metal layer disposed on the second surface of the ceramic layer. The second metal layer can be exposed external to the semiconductor device package. The second metal layer can be electrically isolated from the first metal layer by the ceramic layer.

19 Claims, 7 Drawing Sheets

(56) References Cited

U.S. PATENT DOCUMENTS

| | | | |
|---|---|---|---|
| 2012/0319260 A1* | 12/2012 | Kim | H01L 23/49531 |
| | | | 257/676 |
| 2013/0015495 A1* | 1/2013 | Hauenstein | H01L 25/072 |
| | | | 257/140 |
| 2013/0069213 A1* | 3/2013 | Sohn | H01L 23/4334 |
| | | | 257/668 |
| 2015/0332992 A1* | 11/2015 | Im | H01L 24/49 |
| | | | 257/676 |
| 2019/0181125 A1* | 6/2019 | Cho | H01L 25/115 |

* cited by examiner

SEMICONDUCTOR DEVICE PACKAGE ASSEMBLIES AND METHODS OF MANUFACTURE

CROSS-REFERENCE TO RELATED APPLICATIONS

This application claims the benefit of U.S. Provisional Patent Application No. 62/895,877, filed on Sep. 4, 2019, the entire contents of which is incorporated herein by reference.

TECHNICAL FIELD

This description generally relates to semiconductor device package assemblies, such as semiconductor device package assemblies with electrically isolated, external thermal dissipation surfaces, and associated methods of manufacture.

BACKGROUND

Implementations of semiconductor device packages can include an externally exposed surface (e.g., metallic surface) that is used for dissipating heat generated by operation of an associated semiconductor device (or devices), where the external, thermal dissipation surface is electrically connected (directly or indirectly) to a semiconductor device (die) and/or to semiconductor devices included in the package, such as through a surface of the die, a die attach paddle, a metal heat slug, etc. In such implementations, an external heat transfer mechanism (e.g., a heatsink, heat pipe, etc.) can also be used (in conjunction with the heat dissipation surface of the package) to dissipate heat generated by the semiconductor device during operation, and a thermal interface material (TIM) can be disposed between the external thermal dissipation surface of the package and the external heat transfer mechanism.

In such implementations, the TIM can provide electrical isolation between the external heat transfer mechanism and the externally exposed, thermal dissipation surface of the package. Such TIMs, however, can undesirably increase thermal resistance between the semiconductor device or devices (one or more semiconductor die) and the external heat transfer mechanism (e.g., heatsink, heat pipe, etc.). Such thermal resistance can be referred to as the junction to sink thermal resistance ($R_{thj\text{-}s}$). Such increased thermal resistance can result in excessive heating of a semiconductor device (e.g., a power semiconductor device), which can cause damage to the semiconductor device (or other components in a system including the semiconductor device), and/or can reduce an operating lifetime of the device or associated components (e.g., reduce device and/or system reliability). Furthermore, use of such TIMs can increase manufacturing and/or product costs due to, at least, material costs, as well as processing operations associated with coupling a TIM with an associated semiconductor device package and external heat transfer mechanism.

SUMMARY

In one general aspect, a semiconductor device package can include a die attach paddle having a first surface and a second surface that is opposite the first surface. The package can also include a semiconductor die coupled with the first surface of the die attach paddle. The package can also include a direct-bonded-metal (DBM) substrate. The DBM substrate can include a ceramic layer having a first surface and a second surface that is opposite the first surface; a first metal layer disposed on the first surface of the ceramic layer and coupled with the second surface of the die attach paddle; and a second metal layer disposed on the second surface of the ceramic layer. The second metal layer can be exposed external to the semiconductor device package. The second metal layer can be electrically isolated from the first metal layer by the ceramic layer.

The details of one or more implementations are set forth in the accompanying drawings and the description below. Other features will be apparent from the description and drawings, and from the claims.

Figure 1:
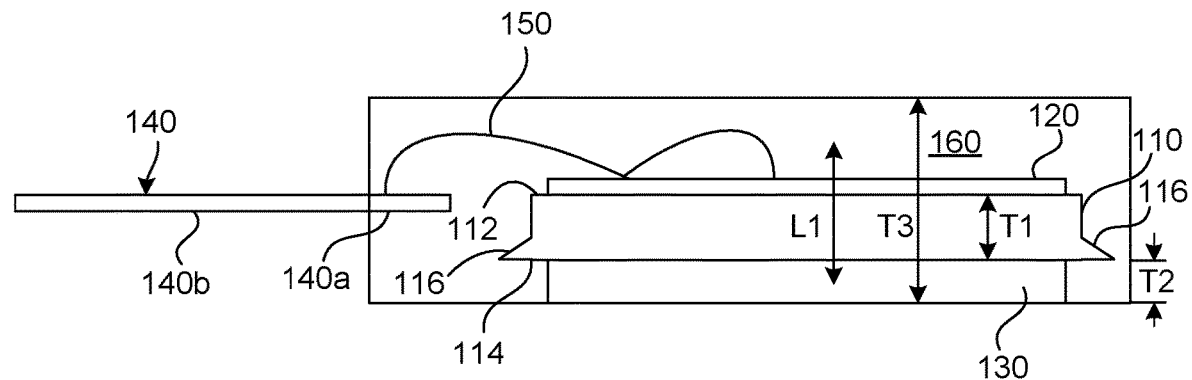
FIG. 1 is a diagram that schematically illustrates a semiconductor device package assembly.

In the drawings, reference numbers for like or similar elements may not be shown for each of those elements. Also, reference numbers from one view of a given implementation may be not be repeated in the related views. Further, in some instances, for purposes of comparing different views, reference numbers from one view of given implementation may be repeated in other views, but may not be specifically discussed with respect to each view.

DETAILED DESCRIPTION

A semiconductor device assembly (e.g., semiconductor device package, packaged semiconductor device, packaged device, etc.), such as those described herein, can include a die attach paddle, one or more semiconductor die (e.g., disposed on the die attach paddle), one or more signal leads, one or more wire bonds electrically coupling the one or semiconductor die and/or the one or more signal leads with each other, and an isolation substrate. The example implementations described herein can overcome at least some of the drawbacks discussed above. For instance, in some implementations, an isolation substrate can include a ceramic substrate that electrically isolates an external thermal dissipation surface (e.g., a metal layer disposed on the ceramic substrate) from the one or semiconductor die, the die attach paddle, etc. Further, use of an isolation substrate, such as in the example implementations described herein, can allow for elimination of a thermal interface material (TIM), elimination of TIM associated manufacturing operations, and/or can reduce overall thermal resistance of a packaged semiconductor device and heatsink (e.g., $R_{thj\text{-}s}$).

FIG. 1 is a diagram that schematically illustrates a semiconductor device package assembly (package) 100. As shown in FIG. 1, the package 100 includes a die attach paddle (DAP) 110, a semiconductor die (or multiple semiconductor die) 120 and an isolation substrate 130. The package 100 also includes a signal lead (or multiple signal leads) 140 and wire bonds 150, where the wire bonds 150 electrically couple the signal leads(s) 140 with the semiconductor die 120 (or can electrically couple different semiconductor die 120 with each other, or can electrically couple the semiconductor die 120 with the DAP 110). As further shown in FIG. 1, the package 100 can also include a molding compound 160 that at least partially encapsulates the other elements of the package 100.

As illustrated in FIG. 1, the DAP 110 has a first surface 112 and a second surface 114 that is opposite the first surface 112. In the package 100, the semiconductor die 120 is disposed on (coupled with, etc.) the first surface 112 of the DAP 110. In this example, the DAP 110 has a thickness T1 that is measured along a line L1, where the line L1 is orthogonal to the first surface 112 and the second surface 114 of the DAP 110. In some implementations, the thickness T1 of the DAP 110 can be greater than or equal to 0.5 millimeters (mm), which can allow the DAP 110 to efficiently absorb (e.g., remove, etc.) thermal energy associated with rapid changes (transients) in heat generated by the semiconductor die 120. By way of analogy to electrical circuits, the DAP 110 can act as a thermal capacitor (as well as a thermal conductor) that rapidly removes (stores) heat generated by the semiconductor die 120, where that absorbed (removed) heat is then transferred external to the package 100 through the isolation substrate 130.

As shown in FIG. 1, the DAP 110 can include a protrusion (tab, flange, extension, etc.) 116. The protrusion 116 can extend, at least in part, around a perimeter of the DAP 110, such as in the example shown in FIG. 4, which is described below. In some implementations, the protrusion 116 can be formed using metal swaging, stamping, etching, etc. The protrusion 116 can, for example, be configured to act as a molding compound lock for the package 100. For instance, the protrusion 116 can include multiple surfaces that are in contact with (form an interface with, etc.) the molding compound 160, such that the protrusion 116 helps secure (e.g., fixedly secure) the molding compound 160 in place in the package 100, so as to prevent delamination of the molding compound 160 from the DAP 110, from the semiconductor die 120 and/or from the isolation substrate 130. Such delamination can occur, for example, due to mismatches between respective coefficients of thermal expansion (CTEs) of the elements of the package 100, such as between the DAP 110 and the molding compound 160.

Also, in some implementations, to further prevent such delamination, a material included in the DAP 110 can be selected to reduce such CTE mismatches. For instance, depending on the particular implementation, the DAP 110 can include copper, a copper alloy, aluminum, a cladded metal structure including a stack of copper, iron and copper, a cladded metal structure including a stack of copper, nickel, iron and copper etc., where the material (or materials) included in the DAP 110 are selected so as to reduce a CTE mismatch between the DAP 110 and, e.g., the molding compound 160, as compared to other DAP materials. In some implementations, the molding compound 160 can be, for example, an epoxy molding compound, though other molding compound substances can be used.

While discussed in further detail below, briefly with respect to FIG. 1, in some implementations, the isolation substrate 130 can be a direct-bonded-metal (DBM) substrate that is coupled to (disposed on, etc.) the second surface 114 of the DAP 110. As shown in FIG. 1, the isolation substrate 130 can have a thickness T2 that is measured along the line L1, where the thickness T2 can be in a range of, for example, 4.5 to 6.0 mm. As also illustrated in FIG. 1, the encapsulated portion of the package 100 can have a thickness T3 that is also measured along the line L1, where the thickness T3 can be in a range of 4.5 to 6.0 mm.

As shown in FIG. 1, in the package 100, the molding compound 160 encapsulates (e.g., fully encapsulates) the DAP 110, the semiconductor die 120 and the wire bond(s) 150. Further in the example package 100, the molding compound 160 partially encapsulates the isolation substrate 130 and the signal leads 140. For instance, as shown in FIG. 1, the isolation substrate 130 has a surface (e.g., a metal, thermal dissipation surface) that is exposed through the molding compound 160. Also, the signal lead 140 includes a first portion 140a that is disposed within (encapsulated by) the molding compound 160, and a second portion 140b that is disposed outside (not encapsulated by) the molding compound 160.

Figure 2A:
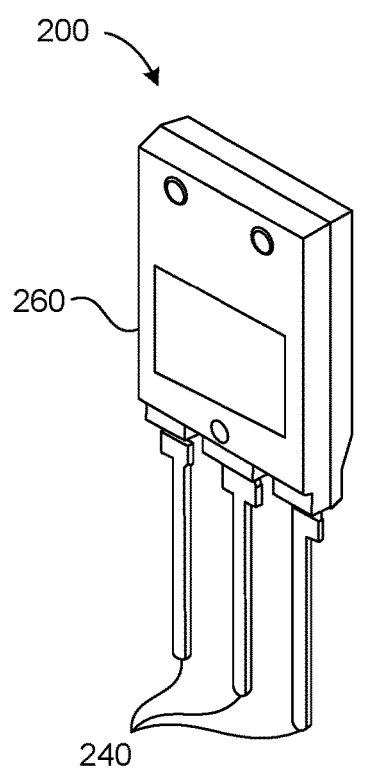
FIGS. 2A through 2D are diagrams that illustrate various isometric views of a semiconductor device package assembly and components of a semiconductor device package assembly.
Figure 2B:
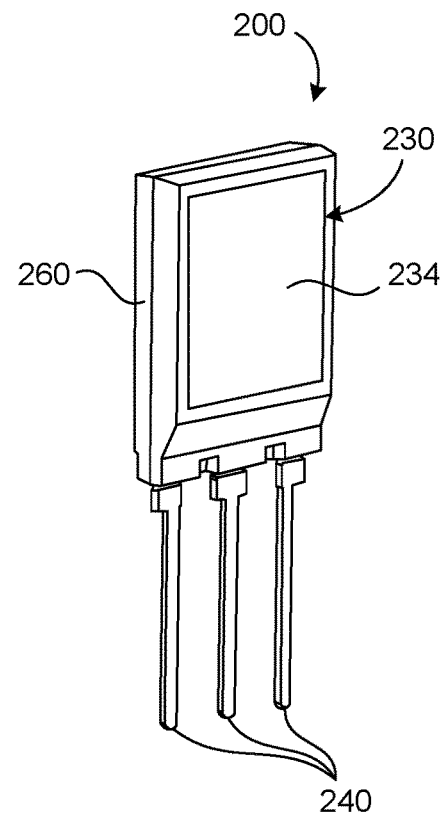

FIGS. 2A through 2D are diagrams that illustrate various isometric views of a semiconductor device package assembly (package) 200 and components (e.g., sub-elements) of the package 200, where the package 200 can be an implementation of the package 100 of FIG. 1. FIGS. 2A and 2B illustrate, respectively, isometric views of the package 200 from a first side (FIG. 2A) and a second side (FIG. 2B). As shown in FIGS. 2A and 2B, the package 200 includes an isolation substrate 230, signal leads 240 and a molding compound 260. As with the package 100, the molding compound 260 can encapsulate, at least partially, the elements of the package 200. For instance, as shown in FIGS. 2A and 2B, the signal leads 240 can extend from the molding compound 260 (e.g., can be partially encapsulated in the molding compound 260).

Figure 6:
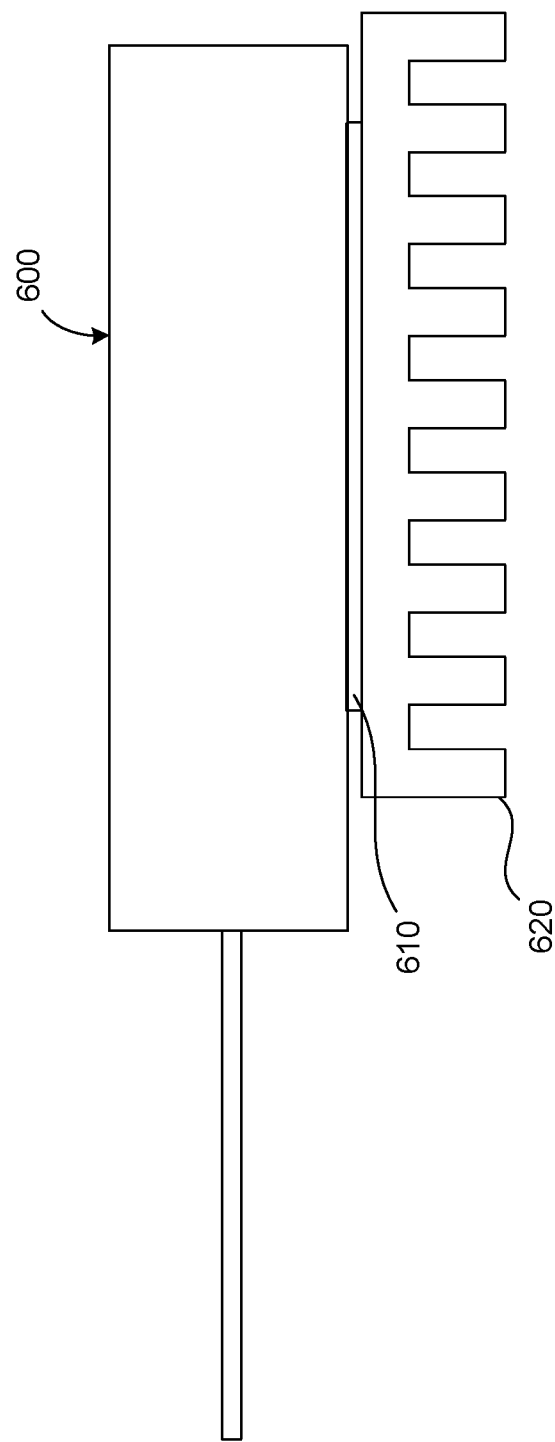
FIG. 6 is a diagram than schematically illustrates a semiconductor device package and an external heatsink.

As shown in FIG. 2B, the isolation substrate 230 can include a metal layer 234 that is exposed through the molding compound 260. As discussed herein, the metal layer 234 can be electrically isolated from other elements of the package 200, such as a DAP, semiconductor die, etc. Further, the metal layer 234 can provide (act as, operate as, etc.) a thermal dissipation surface for the package 200. As described herein, an external heat transfer device (mechanism), such as a heatsink or heat pipe can be directly coupled with the metal layer 234 (e.g., using a solder material, a sinter, and/or other thermally conductive material). Such a configuration, which is illustrated in FIG. 6, can be referred to as a direct-cooling arrangement, as compared to an arrangement that includes a TIM, which can be referred to as an indirect-cooling arrangement.

Figure 2C:
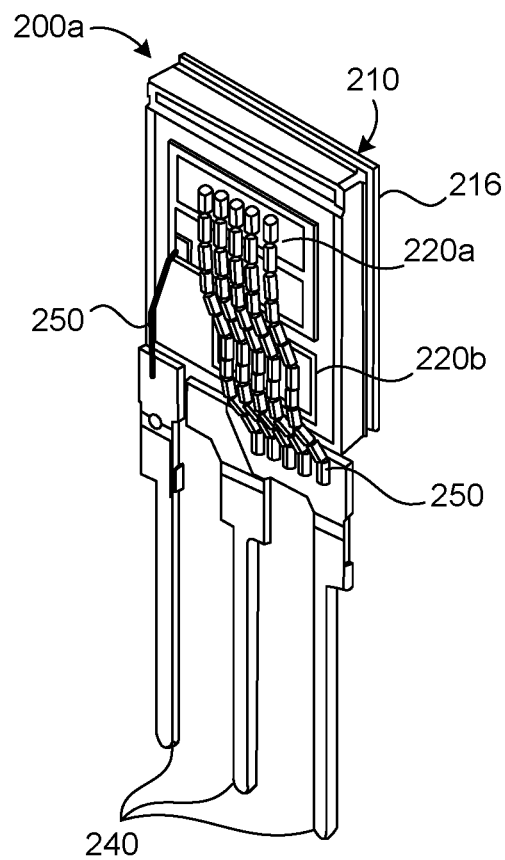
Figure 2D:
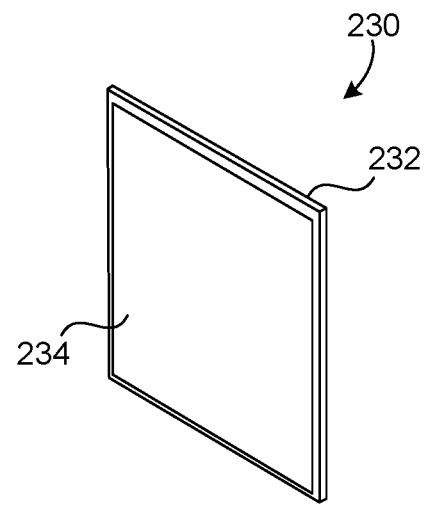

Referring to FIG. 2C, an assembly 200a is illustrated, where the assembly 200a is a sub-assembly of the package 200 that does not include the isolation substrate 230 or the molding compound 260. FIG. 2D is a diagram that illustrates the isolation substrate 230. As shown in FIG. 2C, the assembly 200 includes a DAP 210, a first semiconductor die 220a, a second semiconductor die 220b, signal leads 240 and wire bonds 250. As shown in FIG. 2C, the semiconductor die 220a and 220b are disposed on (coupled with) the DAP 210 using solder, or other appropriate die attach material (such as a conductive epoxy).

As also shown in FIG. 2C, the DAP 210 includes a protrusion 216 that can be configured (as with the protraction 116 of the package 100) to operate as a molding compound lock. As shown in FIG. 2C, the assembly 200a also includes wire bonds that electrically couple the signal leads 240 with the semiconductor die 220a and 220b, as well as electrically coupling the semiconductor die 220a with the semiconductor die 220b.

FIG. 2D illustrates the isolation substrate 230 separate from the package 200. As shown in FIG. 2D, the isolation substrate 230 can include an electrically non-conductive (e.g., ceramic) layer 232 and the metal layer 234, which, as shown in FIG. 2B, can be exposed through the molding compound 260 of the package 200 to provide a thermal dissipation surface. As described herein, the isolation substrate 230 can be a direct-bonded-metal (DBM) substrate, such as direct-bonded copper (DBC) substrate, as is described in further detail below with respect to, for example, FIG. 3B. In some implementations, the metal layer 234 can be disposed over at least a portion (e.g., greater than 90%) of a surface (e.g., surface 232a shown in FIG. 3B) of the non-conductive (e.g., ceramic) layer 232.

Figure 3C:
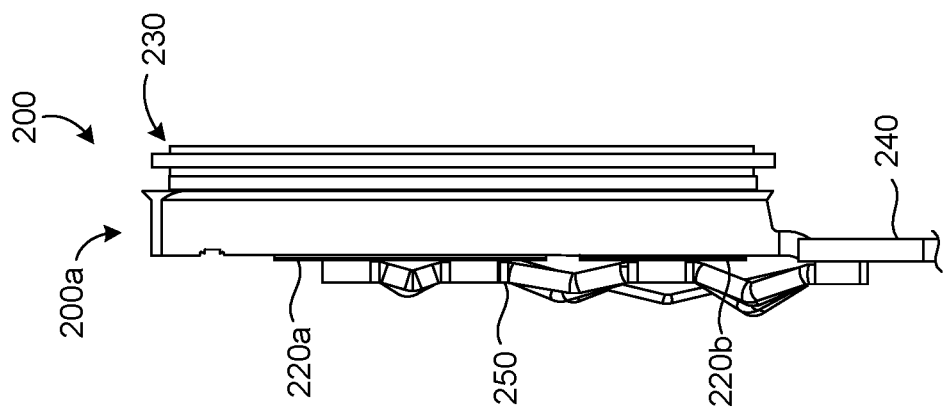
FIGS. 3A through 3D are diagrams that illustrate side views of the semiconductor device package assembly and components of the semiconductor device package assembly of FIGS. 2A through 2D.
Figure 3B:
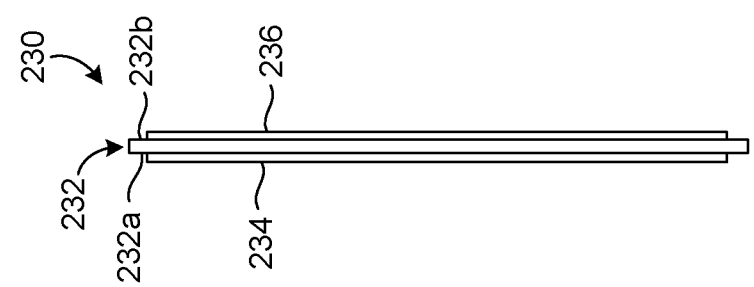
Figure 3A:
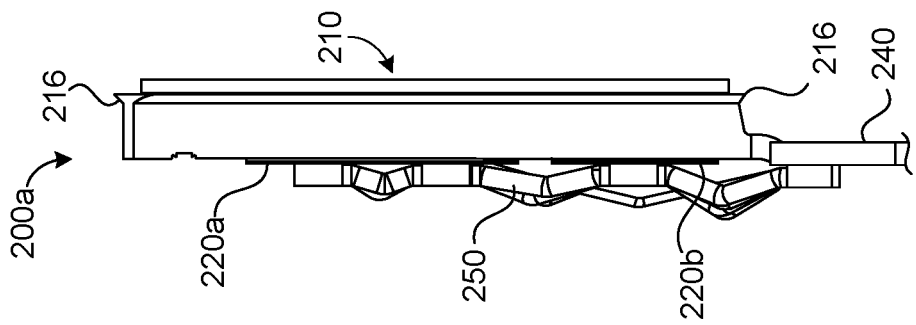

FIGS. 3A through 3D are diagrams that illustrate side views of the assembly 200a and components of the package 200 shown in FIGS. 2A through 2D. For instance, FIG. 3A illustrates a side view of the assembly 200a, where only a portion of the signal leads 240 are shown, as is indicated by a cut line. As shown in FIG. 3A, the semiconductor die 220a and 220b are coupled with the DAP 210 (e.g., a first surface of the DAP 210). In some implementations, the DAP 210 can have a thickness, such as the thickness T1, as was discussed above with respect to the DAP 110 of the package 100.

As also shown in FIG. 3A, the wire bonds 250 provide electrical connections between the signal leads 240 and the semiconductor die 220a and 220b, as well as electrical connections between the semiconductor die 220a and the semiconductor die 220b. As also shown in FIG. 3A, the protrusion 216 of the DAP 210 can extend around at least a portion of the DAP 210.

Referring to FIG. 3B, an example of the isolation substrate 230 is illustrated. As indicated above, the isolation substrate 230 can be a DBM substrate, such as a DBC substrate. As shown in FIG. 3B, the isolation substrate 230 can include a non-conductive (e.g., ceramic) layer 232 that has a first surface 232a, and a second surface 232b that is opposite the first surface 232a. The metal (e.g., copper) layer 234 of the isolation substrate 230 in FIG. 3B is disposed on the first surface 232a of the layer 232. In some implementations, the non-conductive (e.g., ceramic) layer 232 can include at least one of aluminum oxide ($Al_2O_3$), aluminum nitride (AlN), or silicon nitride (SiN).

As further illustrated in FIG. 3B, the isolation substrate 230 includes another metal (e.g., copper) layer 236 that is disposed on the second surface 232b of the non-conductive (e.g., ceramic) layer 232. The metal layer 236, similar to the metal layer 234 on the surface 232a, can be disposed over at least a portion (e.g., greater than 90%) of the surface 232b of the non-conductive (e.g., ceramic) layer 232. In this example, and in the other example implementations described herein, the non-conductive layer (e.g., ceramic layer) 232 electrically isolates the two metal layers 234 and 236 from one another, such that the externally exposed metal layer 234 is electrically isolated from the metal layer 236 that is coupled with the DAP 210. In some implementations, the isolation substrate 230 can have a thickness, such as the thickness T2, as was discussed above with respect to the isolation substrate 130 of the package 100.

FIG. 3C illustrates the portion the assembly 200a shown in FIG. 2A with the isolation substrate 230 coupled with the DAP 210, e.g., on a surface of the DAP 210 that is opposite the surface of the DAP 210 to which the semiconductor die 220a and 220b are coupled, which form the assembly 200 (without the molding compound 260). In some implementations, the isolation substrate can be coupled with the DAP 210 using a solder material. In other implementations, other thermally and/or electrically conductive adhesive materials can be used to couple the isolation substrate 230 with the DAP 210.

Figure 3D:
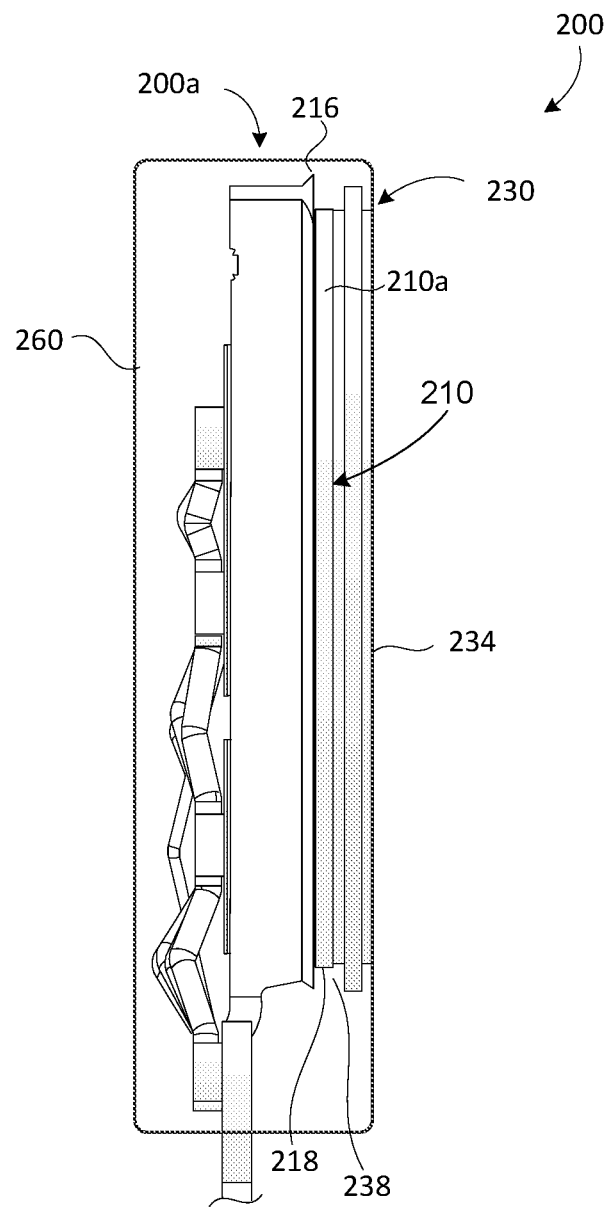

FIG. 3D is a diagram that illustrates the portion of the assembly 200, as shown in FIG. 3C after a molding operation to encapsulate portions of the assembly 200 in the molding compound 260, as shown in the example implementation of FIG. 3D. For purposes of illustration, only an outline of the molding compound 260 is shown in FIG. 3D, so that the elements of the assembly 200 internal to (disposed within, encapsulated by, etc.) the molding compound 260 are visible in FIG. 3D.

As shown in FIG. 3D, the protrusion 216 of the DAP 210, a portion 210a of the DAP 210 between the protrusion 216 and the isolation substrate 230, forms a step 218 that defines an opening 238 (e.g., cavity, recessed area) between the isolation substrate 230 and the protrusion 216 of the DAP 210. That is, the protrusion 216 and the isolation substrate can extend (protrude, etc.) from the portion 210a of the DAP 210 to form the opening 238. In some implementations, such as this example, the opening 238 can extend around a perimeter of the DAP 210. As shown in FIG. 3D, the opening 238 formed by the protrusion 216, the step 218, the DAP 210 (e.g., the portion 210a) and the isolation substrate 230 can improve molding compound locking (e.g., due to the molding compound extending into the opening 238) and, as a result, reduce the risk of delamination of the molding compound 260 from the assembly 200. This further improvement in molding compound locking can further reduce the risk of molding compound delamination.

As also shown in FIG. 3D, the metal layer 234 can be exposed through the molding compound. In some implementations, a thermal dissipation mechanism (e.g., a heat sink, etc.) can be coupled with (e.g., soldered to, etc.) the metal layer 234 to dissipate heat generated during operation of the assembly 200. In this example, the thermal dissipation mechanism would be electrically isolated from the internal elements of the assembly 200 by the non-conductive layer 232 of the isolation substrate 230.

Figure 4:
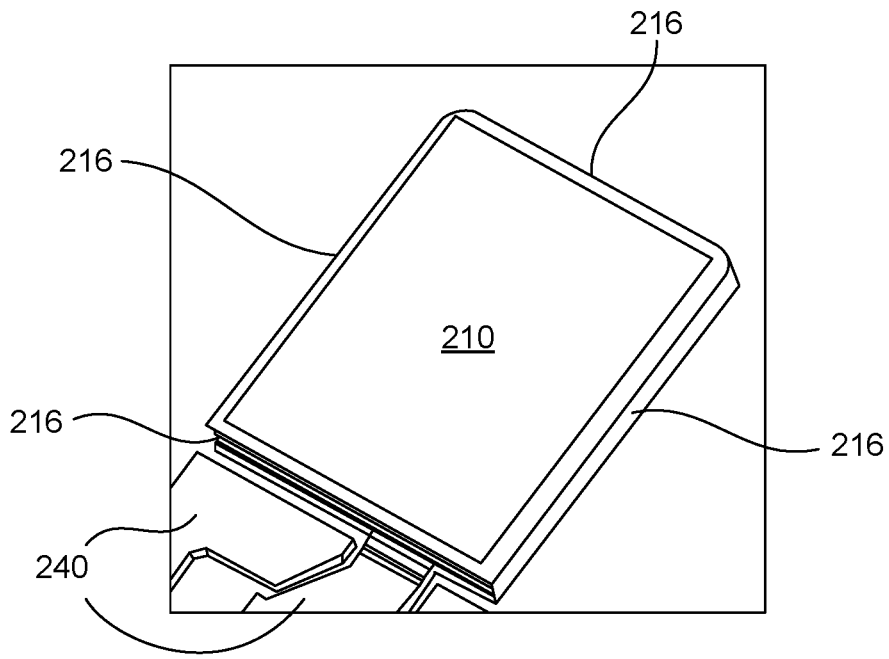
FIG. 4 is a diagram illustrating a die attach paddle of a semiconductor device package assembly.

FIG. 4 is a diagram illustrating a DAP of a semiconductor device package assembly, which, in this example, illustrates the DAP 210 of the package 200. FIG. 4 also illustrates a portion of the signal leads 240 of the package 200, e.g., to show their relative arrangement with respect to the DAP 210. As shown in FIG. 4, the protrusion 216 extends around the entire perimeter of the DAP. As shown in FIG. 4, a surface of the DAP 210 that, in the package 200, is coupled with the isolation substrate 230 is shown. The surface of the DAP 210 on which the semiconductor die 220a and 220b are coupled is not shown in FIG. 4, as it would be on the underside of the DAP 210, as illustrated.

Figure 5:
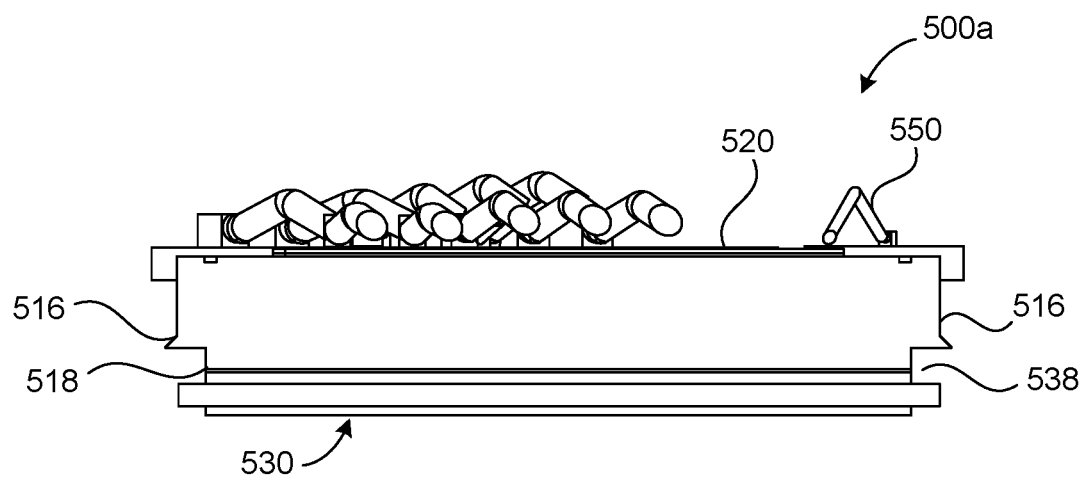
FIG. 5 is a diagram that illustrates a side view of a portion of an assembly that can be included in a semiconductor device package.

FIG. 5 is a diagram that illustrates a side view of a portion of an assembly 500a that can be included in a semiconductor device package (package), such as the package 200. In the illustration of the assembly 500a in FIG. 5, signal leads are not specifically illustrated, though in some implementations, signal leads can be included in a semiconductor device package that includes the assembly 500a.

Similar to the assembly 200a of FIGS. 2C, 3A and 3C, the assembly 500a includes a DAP 520, a semiconductor die 520, an isolation substrate (e.g. a DBM substrate or a DBC substrate) 530, and wire bonds 550. As shown in FIG. 5, which was not illustrated with respect to the packages 100 or 200, one or more wire bonds of the wire bonds 550 can be used to electrically couple the semiconductor die 520 with the DAP 510.

As also shown in FIG. 5, the DAP 510 includes a protrusion 516, such as the protrusion 216 of the DAP 210. In the assembly 500*a*, the DAP 510 includes a step 518 that forms an opening 538 between the isolation substrate 530 and the protrusion 516 of the DAP 510, similar to the arrangement (e.g., step) the protrusion 216 of the DAP 210 and the isolation substrate 230 of the package 200 discussed above. As shown in FIG. 5, the opening formed by the step 518, the DAP 510 and the isolation substrate 530 can, in combination with the protrusion 516, further improve molding compound locking (though a molding compound is not specifically shown in FIG. 5). This further improvement in molding compound locking can further reduce the risk of molding compound delamination. As also shown in FIG. 5, the assembly 500*a* includes a solder (or other adhesive material) that is used to couple the isolation substrate 530 to the DAP 510.

FIG. 6 is a diagram that schematically illustrates an assembly including a semiconductor device package (package) 600 and an external heatsink 620. By way of example, the package 600 can be an implementation of the packages 100 or 200 discussed above. As shown in FIG. 6, the heat sink 620 can be coupled to the package 600 (e.g., to an exposed metal layer of an isolation substrate) in a direct-cooling configuration. For instance, in the example of FIG. 6, the heatsink 620 is directly coupled to the package 600 using a thermally conductive, and/or electrically conductive material 610. In some implementations, the material 610 can a soldering material, a sintering material, and so forth. In some implementation, the assembly of FIG. 6 can have a thermal resistance $R_{thj-s}$ that is reduced by 75% or more, as compared to analogous assemblies with an indirect-cooling arrangement (e.g., using a TIM)

Figure 7:
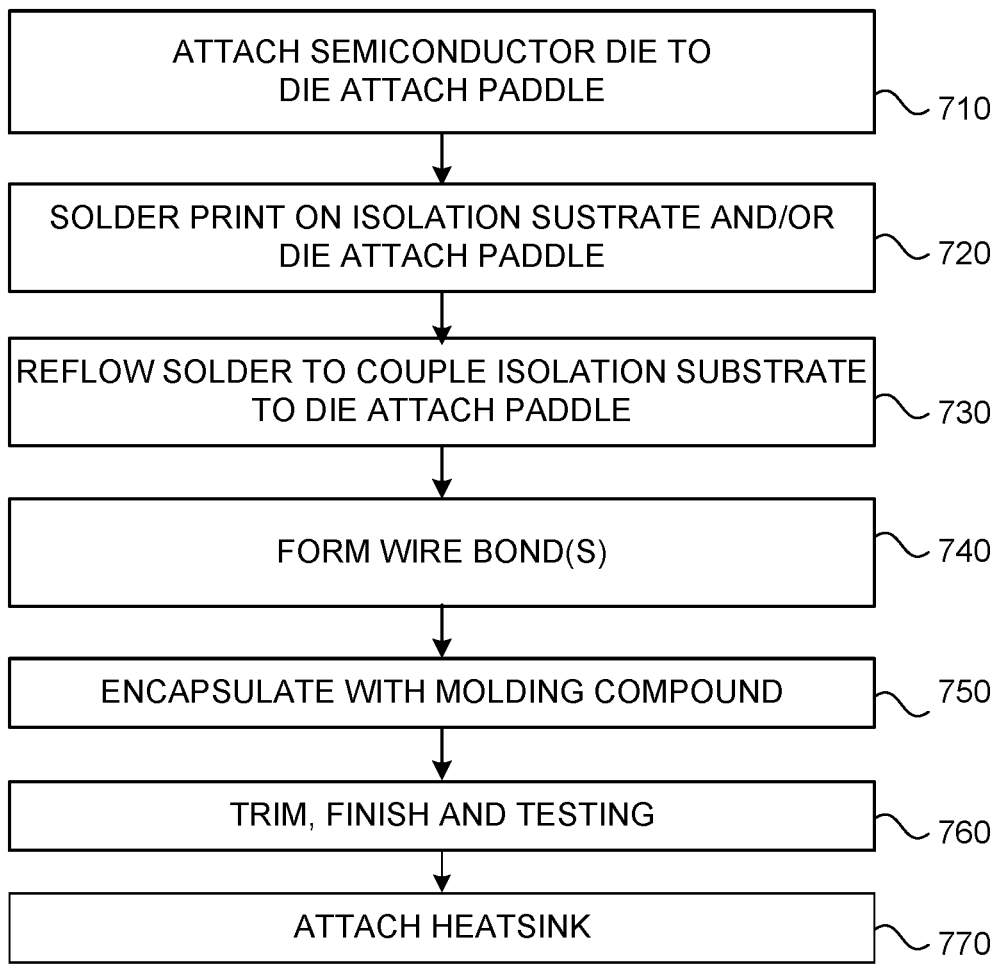
FIG. 7 is a flowchart that illustrates a method for manufacturing semiconductor device package assemblies, such as those described herein.

FIG. 7 is a flowchart that illustrates a method 700 for manufacturing semiconductor device package assemblies, such as those described herein. For purposes of illustration, and by way of example, the method 700 will be described with further reference to the package 200 illustrated in, e.g., FIGS. 2A through 2D, and the assembly illustrated in FIG. 6. The method 700, however, can be used to produce semiconductor device packages and/or assemblies having other configurations or arrangements.

As shown in FIG. 7, the method 700 includes (with reference to the package 200), at block 710, attaching (coupling) semiconductor die 220*a* and 220*b* to the DAP 210. At block 720, the method 700 includes performing a solder print on the isolation (e.g., DBM or DBC) substrate 210 and/or on the surface of the DAP 210 that is opposite the surface of the DAP 210 to which the semiconductor die 220*a* and 220*b* are coupled at block 710. At block 730, the method 700 includes performing a solder reflow operation to couple the isolation substrate 230 with the die attach paddle using the solder print of block 720. At block 740, the method 700 includes forming wire bonds, such as the wire bonds described herein (e.g., wire bonds 150, 250 and/or 550). At block 750, the method 700 includes performing a molding (encapsulation) operation to encapsulate (e.g., fully or partially) the elements of the package 200, such in the example arrangements described herein. At block 760, finish (e.g., dejunk, deflash, plating, singulation, etc.) and electrical testing operations can be performed on the packaged semiconductor device 200. At block 770, a heatsink can be attached to the package 200 in a direct-cooling arrangement, such as illustrated in, and described with respect to FIG. 6.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device package comprising:
   a die attach paddle having a first surface and a second surface that is opposite the first surface;
   a semiconductor die coupled with the first surface of the die attach paddle; and
   a direct-bonded-metal (DBM) substrate including:
   a ceramic layer having a first surface and a second surface that is opposite the first surface;
   a first metal layer disposed on the first surface of the ceramic layer and coupled with the second surface of the die attach paddle; and a second metal layer disposed on the second surface of the ceramic layer and exposed external to the semiconductor device package, the second metal layer being electrically isolated from the first metal layer by the ceramic layer, the die attach paddle including a protrusion extending around at least a portion of a perimeter of the die attach paddle, such that a step of the die attach paddle is defined between the protrusion and the DBM substrate, the protrusion being proximate the second surface of the die attach paddle, the protrusion having a thickness that is less than a thickness of the die attach paddle between the first surface of the die attach paddle and the second surface of the die attach paddle.

2. The semiconductor device package of claim 1, further comprising:
at least one signal lead; and
a wire bond electrically coupling a signal lead of the at least one signal lead with the semiconductor die.

3. The semiconductor device package of claim 2, further comprising a molding compound, the molding compound:
encapsulating the die attach paddle, the semiconductor die and the wire bond; and
partially encapsulating the DBM substrate and the signal lead,
the second metal layer being exposed through the molding compound,
a first portion of the signal lead being disposed within the molding compound, and
a second portion of the signal lead being disposed outside the molding compound.

4. The semiconductor device package of claim 1, wherein:
the DBM substrate is a direct-bonded-copper (DBC) substrate;
the first metal layer is a first copper layer; and
the second metal layer is second copper layer.

5. The semiconductor device package of claim 1, wherein the first metal layer is coupled with the second surface of the die attach paddle using a solder material.

6. The semiconductor device package of claim 1, wherein the ceramic layer includes at least one of aluminum oxide ($Al_2O_3$), aluminum nitride (AlN), or silicon nitride (SiN).

7. The semiconductor device package of claim 1, wherein the die attach paddle has a thickness of greater than or equal to 0.5 millimeters, the thickness being along a line extending orthogonally from the first surface of the die attach paddle to the second surface of the die attach paddle.

8. The semiconductor device package of claim 1, wherein the first metal layer and the second metal layer are disposed over at least 90 percent of the first surface of the ceramic layer and at least 90 percent of the second surface of the ceramic layer, respectively.

9. The semiconductor device package of claim 1, further comprising a molding compound encapsulating the die attach paddle and the semiconductor die, the protrusion having at least one surface in contact with the molding compound.

10. The semiconductor device package of claim 1, further comprising a heatsink, the heatsink being directly coupled to the second metal layer using one of a solder material or a sinter material.

11. A semiconductor device package comprising:
a die attach paddle having a first surface and a second surface that is opposite the first surface;
a semiconductor die coupled with the first surface of the die attach paddle;
a plurality of signal leads;
at least one wire bond electrically coupling a signal lead of the plurality of signal leads with the semiconductor die; and
a direct-bonded-copper (DBC) substrate including:
a ceramic layer having a first surface and a second surface that is opposite the first surface;
a first copper layer disposed on the first surface of the ceramic layer and coupled with the second surface of the die attach paddle; and
a second copper layer disposed on the second surface of the ceramic layer and exposed external to the semiconductor device package, the second copper layer being electrically isolated from the first copper layer by the ceramic layer; and
a molding compound, the molding compound:
encapsulating the die attach paddle, the semiconductor die and the at least one wire bond; and
partially encapsulating the DBC substrate and the plurality of signal leads,
the second copper layer being exposed through the molding compound,
respective first portions of each of the plurality of signal leads being disposed within the molding compound, and
respective second portions of each of the plurality of signal leads being disposed outside the molding compound,
the die attach paddle including a protrusion extending around at least a portion of a perimeter of the die attach paddle, such that a step of the die attach paddle is defined between the protrusion and the DBC substrate, the protrusion being proximate the second surface of the die attach paddle, the protrusion having a thickness that is less than a thickness of the die attach paddle between the first surface of the die attach paddle and the second surface of the die attach paddle, and
the protrusion having at least one surface in contact with the molding compound.

12. The semiconductor device package of claim 11, wherein the die attach paddle has a thickness of greater than or equal to 0.5 millimeters, the thickness being along a line extending orthogonally from the first surface of the die attach paddle to the second surface of the die attach paddle.

13. The semiconductor device package of claim 11, wherein the first copper layer and the second copper layer are disposed over at least 90 percent of the first surface of the ceramic layer and at least 90 percent of the second surface of the ceramic layer, respectively.

14. The semiconductor device package of claim 11, further comprising a heatsink, the heatsink being directly coupled to the second copper layer using one of a soldering material or a sintering material.

15. A method for producing a semiconductor device package, the method comprising:
coupling a semiconductor die with a first surface of a die attach paddle; and
coupling a direct-bonded-metal (DBM) substrate with a second surface of the die attach paddle, the second surface being opposite the first surface, the die attach paddle including a protrusion extending around at least a portion of a perimeter of the die attach paddle, such that a step of the die attach paddle is defined between the protrusion and the DBM substrate, the protrusion being proximate the second surface of the die attach paddle, the protrusion having a thickness that is less than a thickness of the die attach paddle between the first surface of the die attach paddle and the second surface of the die attach paddle, the DBM substrate including:
- a ceramic layer having a first surface and a second surface that is opposite the first surface;
- a first metal layer disposed on the first surface of the ceramic layer, the first metal layer being coupled with the second surface of the die attach paddle; and
- a second metal layer disposed on the second surface of the ceramic layer, the second metal layer being electrically isolated from the first metal layer by the ceramic layer.

16. The method of claim 15, wherein coupling the DBM substrate with the second surface of the die attach paddle include soldering the first metal layer of the DBM substrate to the second surface of the die attach paddle.

17. The method of claim 15, further comprising forming a wire bond to electrically connect a signal lead of the semiconductor device package to the semiconductor die.

18. The method of claim 17, further comprising performing a molding operation to:
- encapsulate the die attach paddle, the semiconductor die and the wire bond in a molding compound, such that the protrusion has at least one surface in contact with the molding compound; and
- partially encapsulate the DBM substrate and the signal lead in the molding compound, the second metal layer being exposed through the molding compound, a first portion of the signal lead being disposed within the molding compound, and a second portion of the signal lead being disposed outside the molding compound.

19. The method of claim 18, further comprising coupling a heatsink directly to the second metal layer using one of a solder material or a sinter material.

* * * * *